United States Patent [19]

Kubota et al.

[11] Patent Number: 5,635,669

[45] Date of Patent: Jun. 3, 1997

[54] MULTILAYER ELECTRONIC COMPONENT

[75] Inventors: Kenji Kubota; Norio Sakai; Shoichi Kawabata, all of Nagaokakyo, Japan

[73] Assignee: Murata Manufacturing Co., Ltd., Japan

[21] Appl. No.: 483,799

[22] Filed: Jun. 7, 1995

Related U.S. Application Data

[63] Continuation-in-part of Ser. No. 96,719, Jul. 23, 1993, abandoned, which is a continuation of Ser. No. 445,918, May 22, 1995.

[30] Foreign Application Priority Data

Jul. 27, 1992 [JP] Japan ................................ 4-199795

[51] Int. Cl.⁶ .................... H02G 3/08; H01L 23/02; H01R 29/00; H05K 7/00
[52] U.S. Cl. ................ 174/52.1; 439/45; 439/68; 361/735; 361/790; 361/803; 257/686
[58] Field of Search ................ 361/729, 731, 361/735, 790, 744, 803; 174/52.1, 52.2; 257/685, 686, 777; 439/43, 44, 45, 46, 68, 69; 437/208, 915

[56] References Cited

U.S. PATENT DOCUMENTS

| | | | |
|---|---|---|---|
| 4,511,201 | 4/1985 | Baker. | |
| 4,586,972 | 5/1986 | Yokotani | 156/89 |
| 4,730,241 | 3/1988 | Takaya | 363/19 |
| 4,790,894 | 12/1988 | Homma | 156/250 |
| 4,874,721 | 10/1989 | Kimura | 437/209 |
| 4,973,799 | 11/1990 | Soma | 174/260 |
| 5,140,745 | 8/1992 | McKenzie | 29/852 |
| 5,220,483 | 6/1993 | Scott | 361/313 |
| 5,225,969 | 7/1993 | Takaya | 361/414 |
| 5,488,765 | 2/1996 | Kubota | 29/593 |

FOREIGN PATENT DOCUMENTS

| | | | |
|---|---|---|---|
| 0104580 | 9/1983 | European Pat. Off.. | |
| 3921651 | 1/1991 | Germany. | |
| 63-208252 | 8/1988 | Japan | 257/777 |
| 2-142173 | 5/1990 | Japan | 257/787 |
| 3225904 | 10/1991 | Japan. | |
| 1089925 | 11/1967 | United Kingdom. | |

Primary Examiner—Leo P. Picard
Assistant Examiner—Stephen T. Ryan
Attorney, Agent, or Firm—Ostrolenk, Faber, Gerb & Soffen, LLP

[57] ABSTRACT

A multilayer electronic component having reduced arrangement pitches for external electrodes is formed by providing via holes in a mother laminate with conductive materials. The mother laminate is obtained by stacking a plurality of insulating sheets with interposition of conductor films in positions that are parted by cutting. The conductive materials define external electrodes for individual multilayer electronic components which are obtained by cutting the mother laminate. A specific step for forming the external electrodes is not required, and characteristics of each multilayer electronic component can be efficiently measured while each multilayer electronic component is still part of the mother laminate.

13 Claims, 12 Drawing Sheets

MULTILAYER ELECTRONIC COMPONENT

This application is a Continuation-In-Part of application Ser. No. 08/096,719 filed Jul. 23, 1993, now abandoned, which was continued in application Ser. No. 08/445,918, filed May 22, 1995.

BACKGROUND OF THE INVENTION

1. Field of the Invention

The present invention relates to a multilayer electronic component having internal circuit elements arranged therein, and more particularly, it relates to an improvement in forming external electrodes in a multilayer electronic component.

2. Description of the Background Art

A multilayer electronic component, which is represented by a multilayer capacitor, a multilayer inductor, a multilayer circuit board or a multilayer composite electronic component, for example, comprises a laminate which is obtained by stacking a plurality of insulating sheets with interposition of internal circuit elements such as conductor films and/or resistor films. The insulating sheets are typically prepared from ceramic sheets.

FIG. 15 shows a conventional multilayer electronic component 1 in which a laminate 2 is obtained by stacking a plurality of insulating sheets with interposition of internal circuit elements (not shown). The laminate 2 is provided on its four side surfaces, for example, with respective external electrodes 3. These external electrodes 3 are electrically connected with the internal circuit elements which are located in the interior of the laminate 2. The external electrodes 3 are formed by applying suitable metal paste to specific positions of the respective side surfaces of the laminate 2. Portions of the external electrodes 3 extend to the upper and lower surfaces of the laminate 2 as seen in FIG. 15.

FIG. 16 shows another type of conventional multilayer electronic component 4, which also comprises a laminate 5 that is obtained by stacking a plurality of insulating sheets with interposition of internal circuit elements (not shown). The laminate 5 is provided on its four side surfaces, for example, with external electrodes 6 which are electrically connected with the internal circuit elements. These external electrodes 6 are formed by dividing through holes 7, as shown by phantom lines in FIG. 16. Namely, a mother laminate is prepared so that a plurality of multilayer electronic components 4 can be obtained when the mother laminate is cut along prescribed cutting lines. The through holes 7 are formed in the mother laminate and conductor films are formed on inner peripheral surfaces thereof for defining the external electrodes 6. The mother laminate is thereafter cut to divide the through holes 7. Due to the method of forming the conductor films for the external electrodes 6 in such a multilayer electronic component 4, parts of the external electrodes 6 extend to the upper and lower surfaces of the laminate 5.

These multilayer electronic components 1 and 4 are surface-mounted on suitable circuit boards through the external electrodes 3 and 6 in the form of chips.

In both of the aforementioned multilayer electronic components 1 and 4, however, the external electrodes 3 and 6 extend toward the upper and lower surfaces of the laminates 2 and 5. Therefore, when other components are to be mounted on the upper and/or lower surface(s) of such multilayer electronic components 1 and 4 to form a composite electronic component with the components 1 and 4, the areas available for mounting such components are restricted.

Further, the parts of the external electrodes 3 and 6 extending toward the upper and lower surfaces of the laminates 2 and 5 inhibit reduction of arrangement pitches for the external electrodes 3 and 6. In addition, it is relatively difficult to form such parts of the external electrodes 3 and 6 to have uniform sizes and shapes which further inhibits reduction of the arrangement pitches for the external electrodes 3 and 6.

More particularly, in the multilayer electronic component 4 shown in FIG. 16, it is difficult to reduce the diameters of the through holes 7, which are formed by a drill having a diameter of less than 0.3 mm. This also restricts the arrangement pitches for the external electrodes 6. Further, the drill for forming the through holes 7 has a relatively short life further increasing the cost of manufacturing the electronic component.

In the multilayer electronic component 1 shown in FIG. 15, the external electrodes 3 are formed on the four side surfaces of the laminate 2, respectively. Hence, it is necessary to perform four separate application steps for applying the metal paste onto the respective side surfaces. As a result, the number of steps for forming the external electrodes 3 is increased.

It is necessary to measure the electric characteristics of the multilayer electronic components 1 and 4 before shipping the components 1 and 4. In both of the multilayer electronics components 1 and 4, however, the electric characteristics cannot be measured unless the components 1 and 4 are in states that are similar to those when the components 1 and 4 are used as chips. In the multilayer electronic component 1 shown in FIG. 15, measurement of the electric characteristics is possible only after formation of the external electrodes 3. Also in the case shown in FIG. 16, the characteristics of each multilayer electronic component 4 cannot be measured while the component 4 is in the form of the mother laminate. Such measurement of the electric characteristics is possible only when the mother laminate is cut to divide the through holes 7.

SUMMARY OF THE INVENTION

Accordingly, an object of the present invention is to provide a multilayer electronic component which can reduce arrangement pitches for external electrodes, and a method of manufacturing the same.

Another object of the present invention is to provide a characteristic measuring method which can efficiently measure electric characteristics of a plurality of multilayer electronic components.

A multilayer electronic component according to the present invention comprises a laminate which is obtained by stacking a plurality of insulating sheets with interposition of internal circuit elements, and external electrodes which are formed on outer surfaces of the laminate to be electrically connected with the internal circuit elements. The external electrodes are formed by cutting the insulating sheets thereby exposing at least side portions of via holes that are provided in the insulating sheets and coated with conductive materials.

A method of manufacturing a multilayer electronic component according to the present invention comprises a step of preparing a mother laminate for being cut along prescribed cutting lines for obtaining a plurality of multilayer electronic components. A plurality of mother insulating sheets are stacked with interposition of internal circuit elements for the respective multilayer electronic components and so that the internal circuit elements are distributed in regions parted by the cutting lines. Via holes, coated with conductive materials that are electrically connected with the internal circuit elements, are provided in positions so that the via holes are exposed on cut surfaces by cutting along the cutting lines. The method also comprises a step of cutting the mother laminate along the cutting lines.

A method of measuring characteristics of a multilayer electronic component according to the present invention comprises a step of preparing a mother laminate for being cut along prescribed cutting lines for obtaining a plurality of multilayer electronic components. A plurality of mother insulating sheets are stacked with interposition of internal circuit elements for the respective multilayer electronic components and so that the internal circuit elements are distributed in regions parted by the cutting lines. Via holes, coated with conductive materials that are electrically connected with the internal circuit elements, are provided in positions so that the via holes are exposed on cut surfaces by cutting along the cutting lines. The method also includes a step of forming grooves in the mother laminate along the cutting lines thereby exposing at least the via holes on inner side surfaces of the grooves, and a step of measuring characteristics of each multilayer electronic component by using the via holes exposed on the inner side surfaces of the grooves as external electrodes.

The configuration of the multilayer electronic components provided in the aforementioned characteristic measuring method, i.e., an assembly of the multilayer electronic components comprising the mother laminate provided with the grooves, can be shipped in this state.

According to the inventive multilayer electronic component, the external electrodes are provided by exposing at least side portions of the via hole which are coated with conductive materials. In this case, the via holes can be easily formed to have small diameters by punching without the use of a drill, whereby arrangement pitches for the external electrodes can be reduced. Further, it is possible to avoid the increase in manufacturing cost resulting from a short life of a drill since it is not necessary to use such a drill.

The external electrodes provided by the via holes do not extend circumferentially on at least one major surface of the laminate, whereby at least one major surface of the laminate can be employed entirely as a surface for mounting another component to be formed as a composite with the laminate. Thus, it is possible to improve the density in component mounting.

Since the external electrodes are provided by the conductive materials which are applied to the via holes, it is possible to attain relatively large dimensions corresponding to film thicknesses of the external electrodes by filling up the via holes with the conductive materials. Thus, it is possible to reduce a problem of solder leaching when the multilayer electronic component is soldered to a circuit board. Since the conductive materials for defining the external electrodes are embedded in parts of the via holes, it is possible to improve strength by soldering.

According to the inventive method of manufacturing a multilayer electronic component, the via holes coated with the conductive materials for providing the external electrodes are already formed in the mother laminate so that the conductive materials are exposed to define the external electrodes by cutting the mother laminate, whereby a specific step is not required for providing the external electrodes.

According to the inventive method of measuring characteristics of a multilayer electronic component, it is possible to independently measure characteristics of a plurality of multilayer electronic components, which are mechanically integrated with each other in the form of a mother laminate but are electrically independent of each other due to formation of the grooves. Therefore, it is not necessary to independently handle multilayer electronic components, but characteristics of a number of multilayer electronic components can be efficiently measured for testing each component.

When the assembly of the multilayer electronic components comprising a mother laminate provided with the grooves, which is a configuration to be subjected to the aforementioned measurement of characteristics, is shipped in this state, the user can take out the respective multilayer electronic components from the mother laminate by simply dividing the same along the grooves. It is to be noted that in this case each multilayer electronic component can be mounted with no problem since the component has been subjected to measurement of its characteristics, and the assembly of such multilayer electronic components is easy to pack and handle as compared with multilayer electronic components which are separated from each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
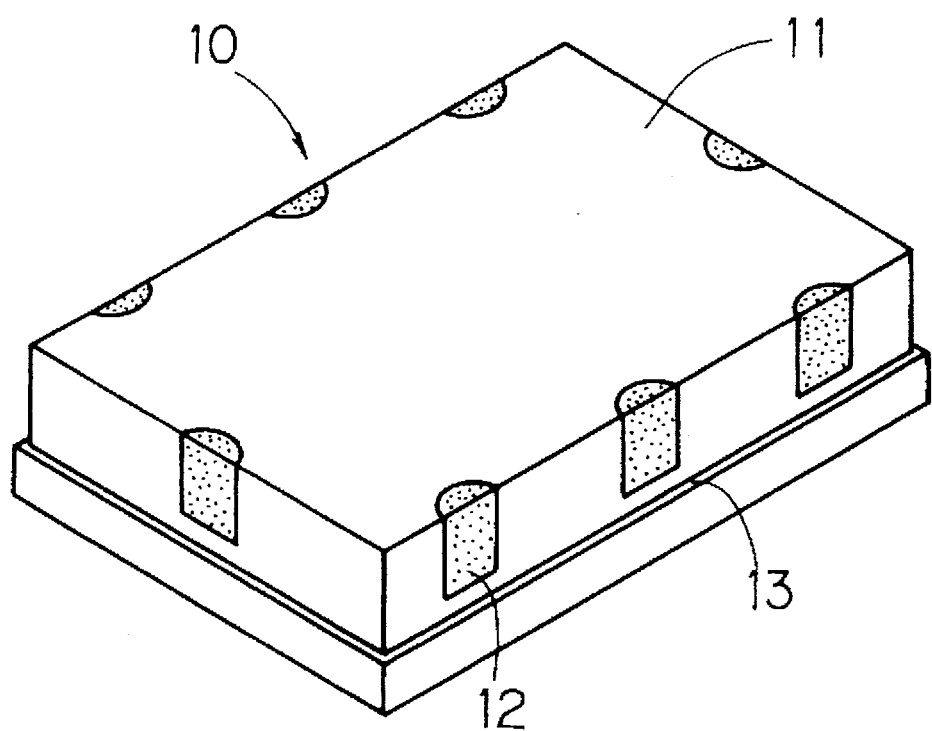
FIG. 1 is a perspective view of a multilayer electronic component 10 according to an embodiment of the present invention.

FIG. 1 is a perspective view of a multilayer electronic component 10 according to an embodiment of the present invention. The multilayer electronic component 10 can be mounted on a suitable circuit board in the chip-type configuration as illustrated. FIG. 1 shows the multilayer electronic component 10 with the surface which faces toward a circuit board being shown facing upwardly.

The multilayer electronic component 10 comprises a laminate 11, which is formed by stacking a plurality of insulating sheets with interposition of internal circuit elements (not shown). The laminate 11 is provided on respective ones of its four side surfaces, for example, with external electrodes 12 which are exposed on outer surfaces of the laminate 11. These external electrodes 12 are electrically connected with the internal circuit elements (not shown).

The aforementioned external electrodes 12 are formed by exposing at least side portions of via holes, which are provided in the insulating sheets and filled up with conductive materials, by cutting the insulating sheets, as clearly understood from the following description of a manufacturing method. The laminate 11 is provided on respective ones of its four side surfaces, for example, with steps 13. The reason why such steps 13 are formed is also clarified by the following description of the manufacturing method.

Figure 2:
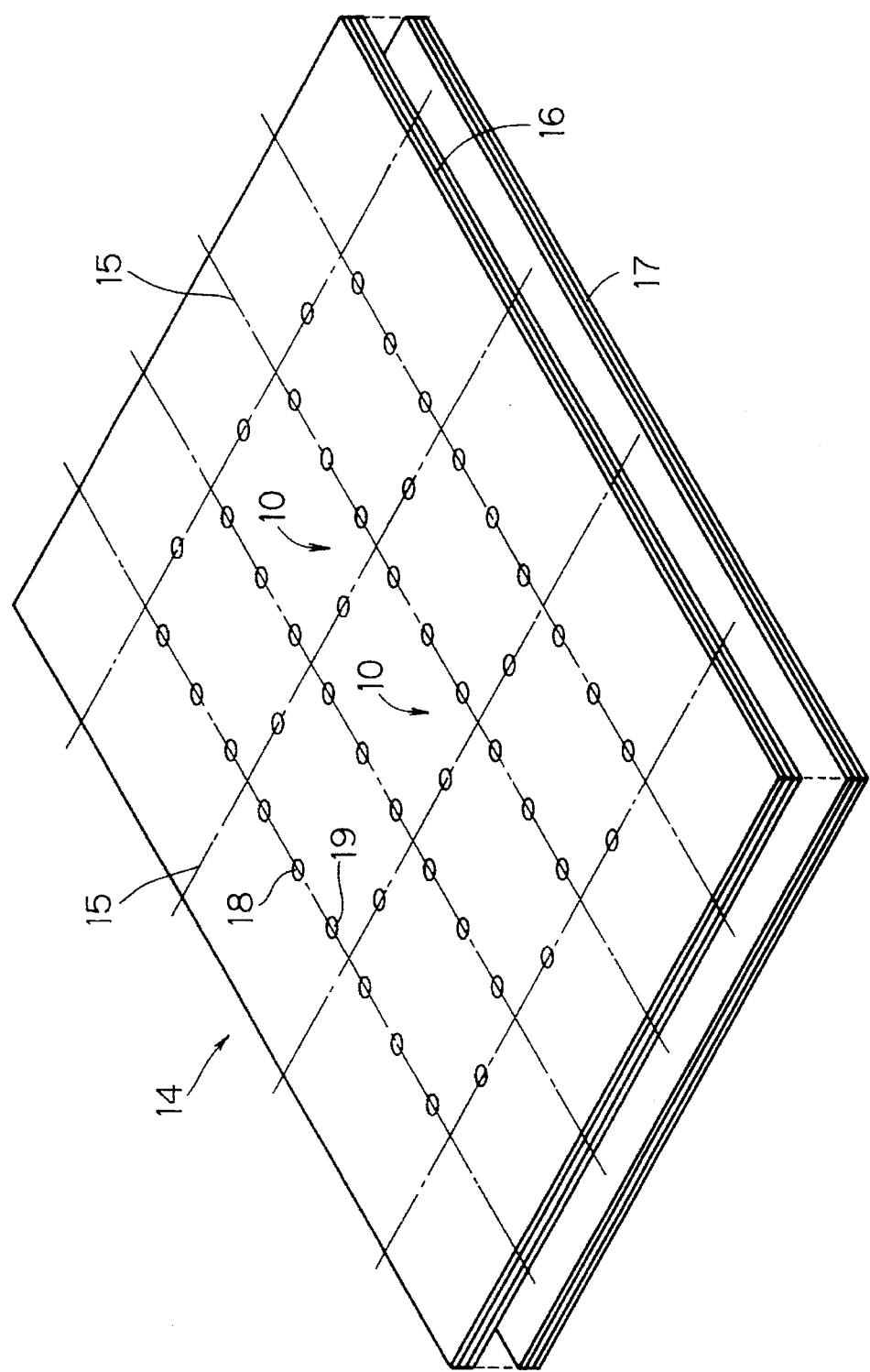
FIG. 2 is a perspective view of a mother laminate 14 which is prepared for obtaining the multilayer electronic component 10 shown in FIG. 1.

In order to obtain the aforementioned multilayer electronic component 10, a mother laminate 14 is prepared as shown in FIG. 2. The mother laminate 14 is to be cut along prescribed cutting lines 15, shown by one-dot chain lines, to provide a plurality of multilayer electronic components 10. The mother laminate 14 is obtained by stacking a plurality of mother insulating sheets 16 and a plurality of mother insulating sheets 17 with interposition of internal circuit elements (not shown). The internal circuit elements are provided for the respective multilayer electronic components 10 and are distributed in respective regions divided along the cutting lines 15. This mother laminate 14 is provided with via holes 19 that are filled up with conductive materials 18. The conductive materials 18 are electrically connected with the internal circuit elements (not shown), and are positioned so as to be partitioned by cutting along the cutting lines 15. The external electrodes 12 shown in FIG. 1 are provided by the conductive materials 18 which are filled up in the via holes 19.

In order to obtain the aforementioned mother laminate 14, the following steps are carried out, for example. According to this embodiment, the mother insulating sheets 16 and 17 are formed by ceramic sheets.

First, sheet forming is carried out by a doctor blade coater or the like, to obtain ceramic green sheets for defining the mother insulating sheets 16 and 17. Specific ones of these ceramic green sheets are provided with via holes by punching or the like, in order to enable electrical conduction through the sheets along the direction of the thickness. At this time, the ceramic green sheets for defining the mother insulating sheets 16, which are located on relatively upper portions in FIG. 2, are further provided with via holes 19. Then, conductor films and/or resistor films for serving as internal circuit elements are printed on specific ones of the ceramic green sheets. At this time, the already formed via holes are filled up with conductive materials, while the via holes 19 shown in FIG. 2 are filled up with conductive materials 18. When the conductor films are printed from lower surface sides of the mother insulating sheets 16 shown in FIG. 2, it is possible to prevent the conductive materials 18 from forming conductive lands in peripheral edge portions of the via holes 19 on upper surface sides of the mother insulating sheets 16. It is pointed out that the conductive lands described above are within the scope of the present invention.

Then, the aforementioned mother insulating sheets 16 and 17 are stacked with each other and pressed. Thus, the mother laminate 14 is obtained. In this mother laminate 14, the via holes 19 provided in the respective ones of the plurality of mother insulating sheets 16 are aligned along the direction of thickness, whereby the conductive materials 18 filled up in the via holes 19 are connected in series with each other.

Then, grooves 20 are formed in the mother laminate 14 along cutting lines 15 (FIG. 2) with a dicing saw, for example, so that at least the via holes 19 are parted, for example. With such formation of the grooves 20, the via holes 19 are exposed on inner side surfaces of the grooves 20, while the conductive materials 18 which are filled up in the via holes 19 are parted so that portions enclosed by the grooves 20 for defining individual multilayer electronic components 10 are electrically independent of each other. Preferably, slits 21 and 22 are formed in bottom surfaces of the grooves 20 and lower surface portions of the mother laminate 14 opposite thereto, respectively. Either one of the slits 21 or 22 may be omitted.

Figure 3:
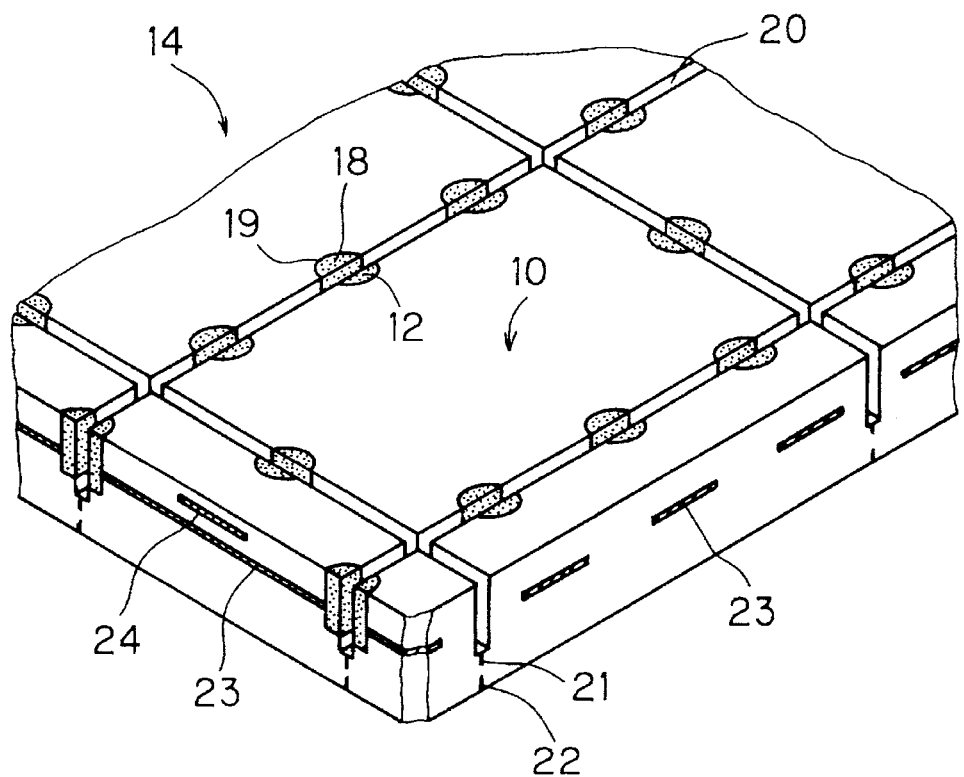
FIG. 3 is an enlarged perspective view of grooves 20 which are formed in the mother laminate 14 shown in FIG. 2 for enabling measurement of characteristics.

FIG. 3 shows some conductor films 23 and 24 for serving as internal circuit elements. This figure also shows states of the conductor films 23 electrically connected with the conductive materials 18.

Then, the mother laminate 14 is fired to sinter the ceramic materials forming the mother insulating sheets 16 and 17. Thereafter, surfaces of the mother laminate 14 are provided with conductor films and/or resistor films, covered with an overcoat, and coated with solder resist. If necessary, conductive materials 18 for forming external electrodes 3 and other conductive films are plated.

When the aforementioned steps are completed, the plurality of multilayer electronic components 10 included in the mother laminate 14 are electrically independent of each other so that it is possible to measure characteristics of each multilayer electronic component 10 while treating the conductive materials 18 provided in the respective portions of the via holes 19 parted by the grooves 20 as external electrodes.

After the characteristics are measured, other electronic components are mounted on those of the multilayer electronic components 10 which have been determined to be nondefective, to form composite electronic components. The steps heretofore described can be efficiently carried out in the state of the mother laminate 14. The multilayer electronic components 10 may be shipped in this stage.

Then, the mother laminate 14 is completely cut along the cutting lines 15 (FIG. 2), i.e., the grooves 20 (FIG. 3), in order to obtain a plurality of multilayer electronic components 10 which are mechanically independent of each other. Such cutting is readily performed by dividing the mother laminate 14 like a chocolate bar along the grooves 20. The aforementioned slits 21 and 22 facilitate such division.

Thus, the multilayer electronic component 10 shown in FIG. 1 is obtained. As understood from the above description, the steps 13 result from the formation of the aforementioned grooves 20. When the laminate 11 is classified into upper and lower half portions through a boundary surface corresponding to the positions of the steps 13, the external electrodes 12 are exposed only on the upper half portion.

Then, if necessary, the multilayer electronic component 10 is covered with a case. This case is adapted to cover other components which may be mounted on a lower surface of the multilayer electronic component 10 shown in FIG. 1. This case is described later with reference to FIGS. 13 and 14.

While the present invention has been described with reference to the embodiment shown in FIGS. 1 to 3, various modifications are possible within the scope of the present invention.

Figure 4:
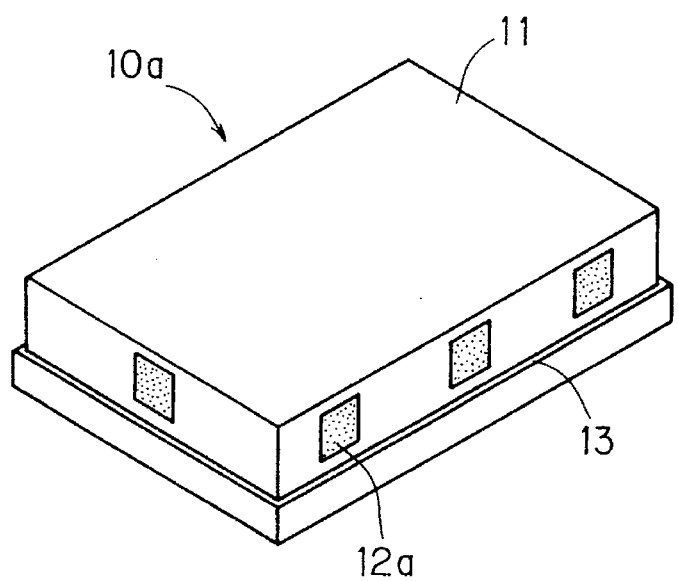
FIG. 4 is a perspective view of a multilayer electronic component 10a according to another embodiment of the present invention.

While the external electrodes 12 shown in FIG. 1 are formed so as to be exposed not only on the side surfaces of the laminate 11 but on the upper surface appearing in FIG. 1, such external electrodes 12a may be formed to be exposed only on side surfaces of a laminate 11 in a multilayer electronic component 10a shown in FIG. 4, for example. Referring to FIG. 4, elements corresponding to those shown in FIG. 1 are denoted by similar reference numerals, to omit redundant description.

According to the multilayer electronic component 10a shown in FIG. 4, it is possible to completely utilize not only a lower surface of the laminate 11 appearing in this figure but the upper surface as mounting surfaces for other components to be combined with the component 10a to form a composite component, with no interference by the external electrodes 12a. In order to obtain such a multilayer electronic component 10a, mother insulating sheets that have no via holes 19 for forming external electrodes may be employed to form some of the sheets that are located on an upper portion of the mother laminate 14 in a stage of manufacturing the mother laminate 14 shown in FIG. 2.

Figure 5:
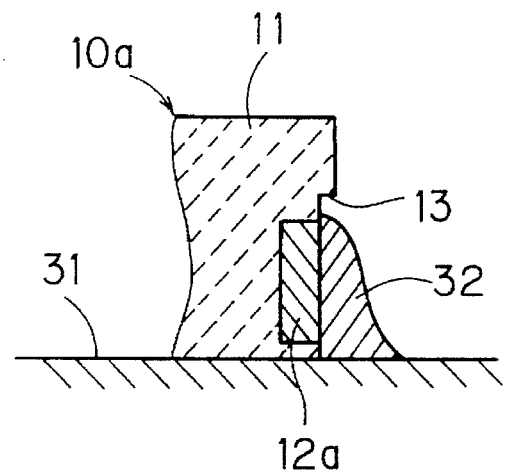
FIG. 5 is a sectional view of the multilayer electronic component 10a shown in FIG. 4 which is mounted on a circuit board 31.

When the aforementioned multilayer electronic component 10a is placed on a circuit board 31 as shown in FIG. 5, a gap is defined between the circuit board 31 and each external electrode 12a. In order to mount the multilayer electronic component 10a on the circuit board 31 in such a state, a solder fillet 32 is advantageously employed in order to electrically connect the external electrode 12a with a conductive land (not shown) on the circuit board 31.

Figure 6:
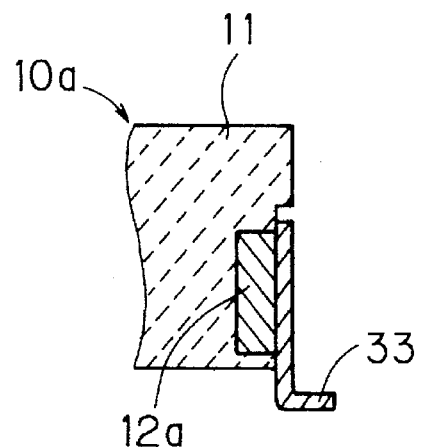
FIG. 6 is a sectional view of a terminal member 33 which is mounted on the multilayer electronic component 10a shown in FIG. 4.

Alternatively, a terminal member 33 of metal may be mounted on each external electrode 12a of such a multilayer electronic component 10a, as shown in FIG. 6.

The external electrodes 12 of the mode shown in FIG. 1 may be mixed with the external electrodes 12a of the mode shown in FIG. 4 in a single multilayer electronic component.

While the via holes 19 for providing the external electrodes 12 have circular sections in the embodiment shown in FIGS. 1 to 3, such sections may be changed to other forms such as rectangular shapes. Further, a single external electrode may be provided by a plurality of via holes which are partially overlapped with each other in section, or by a via hole extending longitudinally from side to side, in order to expose such external electrodes in wider areas.

The grooves 20 and the slits 21 and 22 may be formed after firing of the mother laminate 14. If no efficiency in formation of the conductor films/resistor films on the fired laminate 14 or plating or characteristic measurement is taken into consideration, the mother laminate 14 may be cut along the cutting lines 15 before firing, so that the multilayer electronic components 10 are fired in mechanically separated states. Further, the mother laminate 14 may be cut along the cutting lines 15 immediately after firing, so that the step of forming the grooves 20 is unnecessary.

The conductive materials 18 to be filled up in the via holes 19 does not have to be applied simultaneously with printing of the conductor films. The via holes 19 may be filled up with metal paste in another step. In this case, it is also possible to simultaneously fill up the conductive materials 18 in the plurality of via holes 19 that are aligned in series with each other in the plurality of mother insulating sheets 16 which are stacked with each other.

The insulating sheets are not restricted to ceramic sheets, but may be prepared from other materials.

Figure 7:
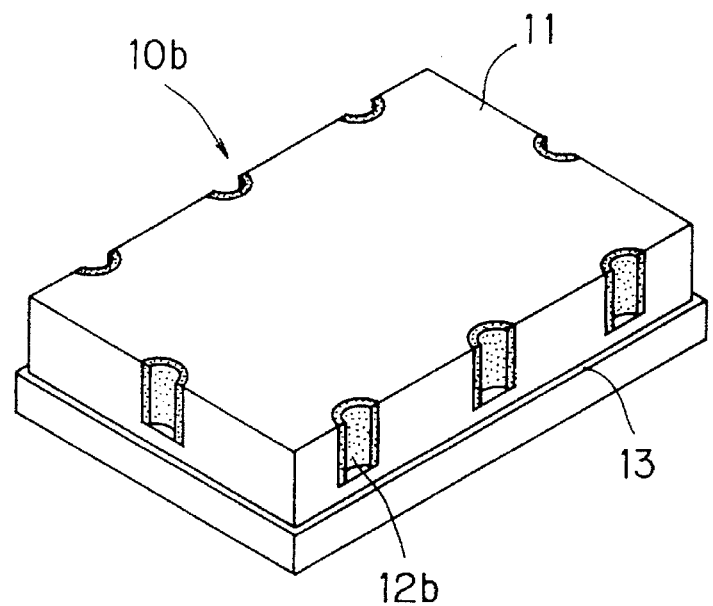
FIG. 7 is a perspective view of a multilayer electronic component 10b according to still another embodiment of the present invention.

As shown in FIG. 7, external electrodes 12b of a multilayer electronic component 10b may be provided by conductive materials which are layered on inner peripheral surfaces of the via holes 19 (FIGS. 2 and 3). In this case, the external electrodes 12b define cavities on outer surfaces thereof.

The present invention is not restricted to a multilayer electronic component having a plurality of external electrodes all of which are formed on the basis of via holes, but is also applicable to a multilayer electronic component including some external electrodes which are formed by another method.

Figure 8:
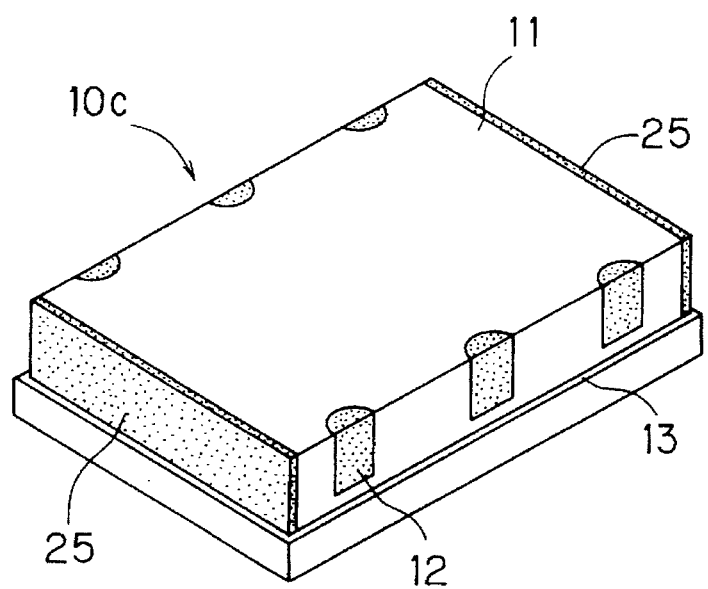
FIG. 8 is a perspective view of a multilayer electronic component 10c according to a further embodiment of the present invention.

As shown in FIG. 8, for example, a multilayer electronic component 10c may have some external electrodes 12 which are formed on the basis of via holes and other external electrodes, such as shielding electrodes 25, for example, which are formed by another method. In formation of the grooves 20 as shown in FIG. 3, for example, grooves 20 having inner side surfaces to be provided with such shielding electrodes 25 are first prepared so that metal paste is filled up in these grooves 20 by injection. Finally, the grooves 20 are cut again to part conductive materials provided by the metal paste, thereby forming the shielding electrodes 25. These shielding electrodes 25 are often electrically connected with ground-side internal circuit elements (not shown) of the laminate 11.

The aforementioned shielding electrodes 25 may alternatively be formed on the basis of via holes, as a matter of course. In this case, the via holes are formed by slots longitudinally extending along the shielding electrodes 25. Such shielding electrodes 25 may be formed after the individual multilayer electronic components 10c are obtained.

Figure 9:
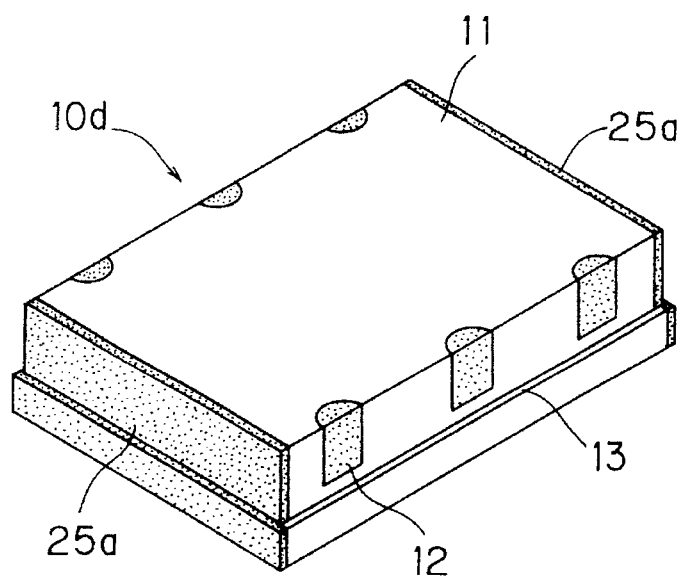
FIG. 9 is a perspective view of a multilayer electronic component 10d according to a further embodiment of the present invention.

As shown in FIG. 9, shielding electrodes 25a may be formed to extend downwardly beyond steps 13, in order to improve shielding performance. Such shielding electrodes 25a can be formed by any of the following methods, for example:

(a) A method of forming the overall shielding electrodes 25a on the basis of via holes.

(b) A method of forming only lower half portions of the shielding electrodes 25a beyond the steps 13 on the basis of via holes while forming upper half portions by filling up the grooves 20 shown in FIG. 3 with metal paste.

(c) A method of forming upper half portions of the shielding electrodes 25a by filling up the grooves 20 with metal paste, obtaining individual multilayer electronic components 10a, and thereafter forming lower half portions.

(d) A method of forming upper half portions of the shielding electrodes 25a on the basis of via holes, obtaining individual multilayer electronic components 10d, and thereafter forming lower half portions.

(e) A method of forming the overall shielding electrodes 25a after obtaining individual multilayer electronic components 10d.

When the method (a) or (b) is employed among the aforementioned methods of forming the shielding electrodes 25a, the plurality of multilayer electronic components 10d are electrically connected with each other through the shielding electrodes 25a and not yet completely electrically independent of each other in a stage provided with the grooves 20 shown in FIG. 3. Measurement of characteristics of the individual multilayer electronic components 10d in the aforementioned state of the mother laminate 14 is not hindered because the shielding electrodes 25a are adapted to serve as a common earthed electrode to thereby allow such characteristics measurement.

In the multilayer electronic component 10d shown in FIG. 9, an area provided on the lower surface of the laminate 11 for mounting other components may be narrowed by the shielding electrodes 25a. In order to avoid such inconvenience, shielding electrodes 25b may be formed so as not to reach a lower surface of a laminate 11 provided in a multilayer electronic component 10e, as shown in FIG. 10.

Figure 10:
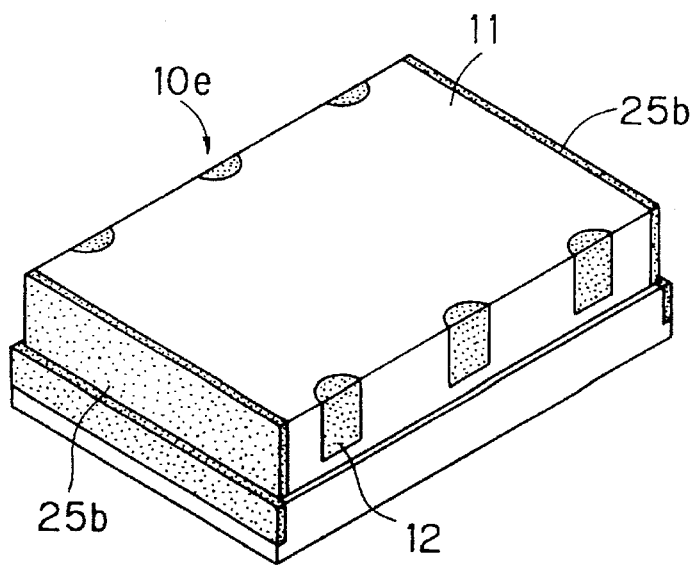
FIG. 10 is a perspective view of a multilayer electronic component 10e according to a further embodiment of the present invention.

In relation to each mode of formation of the shielding electrodes 25, 25a and 25b shown in FIGS. 8 to 10, the upper half portion(s) of the shielding electrode(s) may be formed on only one or three side surfaces of the laminate 11. The lower half portions of the shielding electrodes may be formed on three or four side surfaces of the laminate 11. Although only the shielding electrodes 25 corresponding to upper half portions are provided in FIG. 8, only shielding electrodes corresponding to lower half portions may alternatively be provided.

Figure 11:
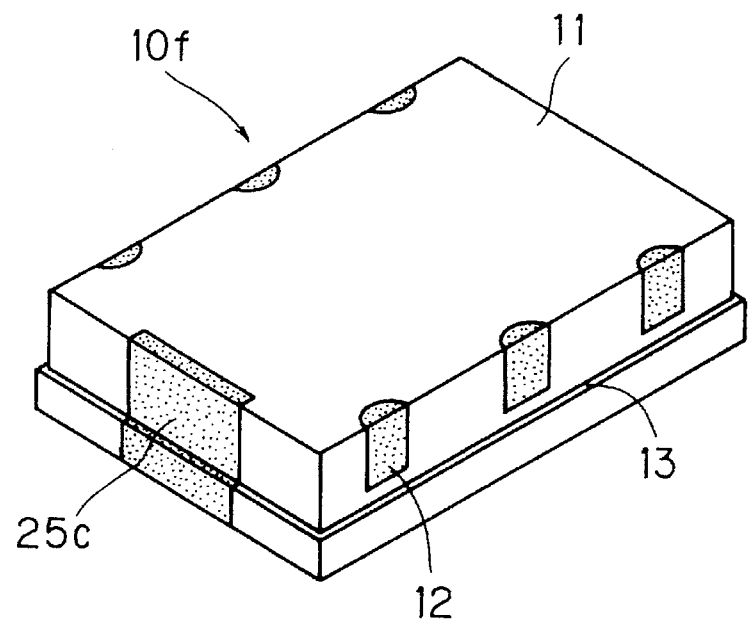
FIG. 11 is a perspective view of a multilayer electronic component 10f according to a further embodiment of the present invention.

As shown in FIG. 11, further, a shielding electrode 25c may be provided on a multilayer electronic component 10f to cover only a part of one side surface of a laminate 11 along the cross-wise direction.

Figure 40:
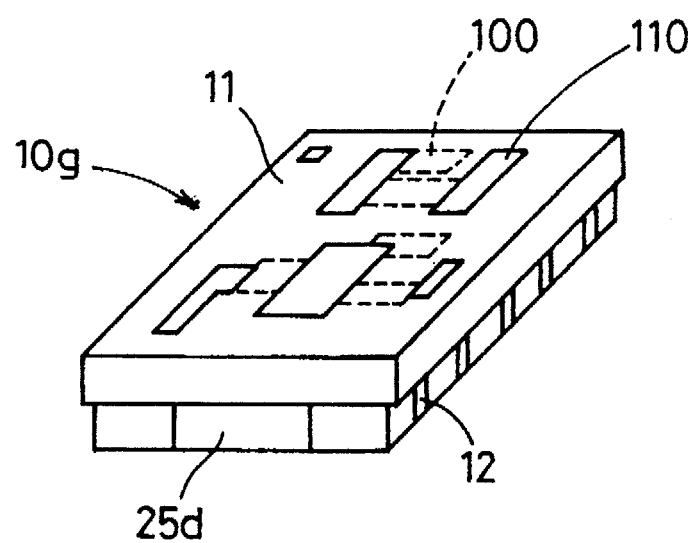
FIG. 40 is a perspective view of a composite component having chip components mounted thereon in accordance with a further embodiment of the present invention.

FIG. 40 shows a multilayer electronic component 10g including external electrodes 12 formed according to one of the methods described above. The component 10g also includes a shielding electrode 25d similar to shielding electrodes 25a–25c. The upper surface of the step 13, visible in FIGS. 7–11, is not visible in FIG. 40. The surface 11a of the laminate 11 shown in FIG. 40 has a plurality of chip components 100 (shown in dotted lines) mounted thereon. The chip components 100 may comprise diodes, transformers, resistors, inductors, capacitors and any other suitable electronic chip components. The surface 11a also includes wiring patterns 110 which are electrically connected to the components 100 and electrically connected to the internal elements in the laminate 11 by via holes (not shown). The wiring patterns 110 may be preferably soldered to the components 100 at appropriate portions.

As can be seen in FIG. 40, the entire area of surface 11a of the multilayer electronic component 10g can be used for surface mounting electronic component chips 100. Also, the efficiency of mounting the chips 100 is improved by the method of forming the external electrodes 12 according to the present invention.

Figure 12:
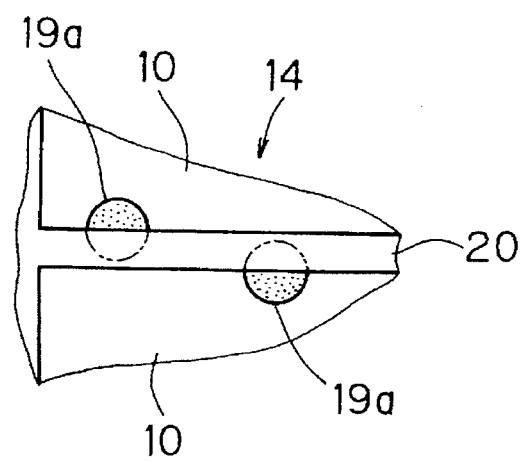
FIG. 12 is a plan view of a part of a mother laminate 14 for illustrating a further embodiment of the present invention.

In each of the aforementioned embodiments, each via hole 19 is parted so as to define external electrodes 12 for respective ones of two multilayer electronic components 10. When the width of each groove 20 shown in FIG. 3 occupies a considerable part along the diameter of each via hole 19, however, a single via hole 19a may be adapted to define a single external electrode, as shown in FIG. 12. FIG. 12 shows parts of the via holes 19a before formation of the groove 20 with two-dot chain lines.

Figure 13:
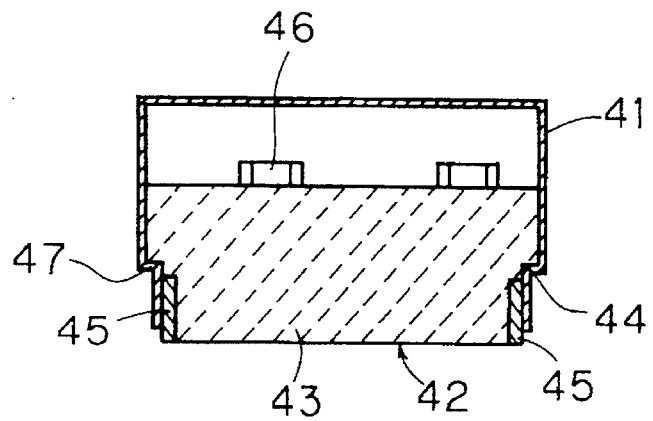
FIG. 13 is a sectional view of a cased multilayer electronic component 42 according to a further embodiment of the present invention.

FIG. 13 is a sectional view showing a multilayer electronic component 42 which is covered with a case 41.

A laminate 43 provided in the multilayer electronic component 42 has steps 44, and external electrodes 45 are formed under these steps 44. Some electronic components 46 are mounted on an upper surface of the laminate 43 appearing in FIG. 13 for forming a composite electronic component with the multilayer electronic component 42. The case 41 is preferably made of metal. This case 41 is provided with steps 47 in conformity with side surfaces of the laminate 43, and soldered to the external electrodes 45, for example.

Figure 14:
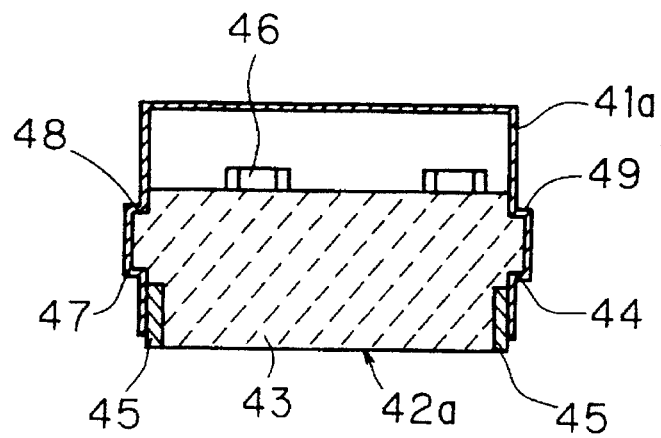
FIG. 14 is a sectional view of a cased multilayer electronic component 42a according to a further embodiment of the present invention.
Figure 15:
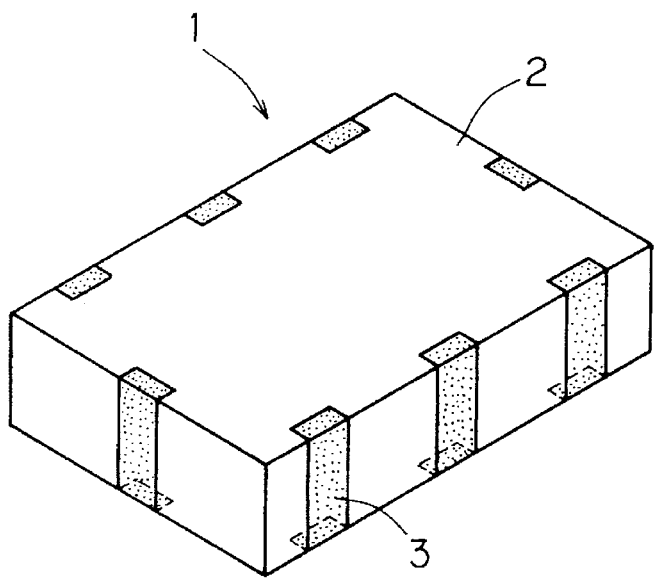
FIG. 15 is a perspective view of a conventional multilayer electronic component 1.
Figure 16:
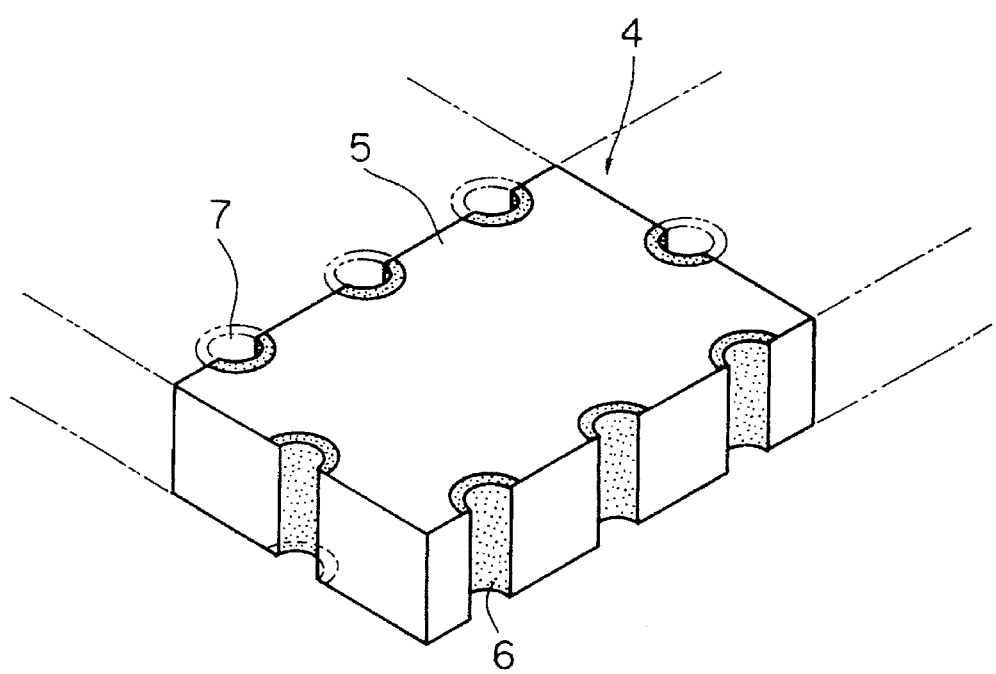
FIG. 16 is a perspective view of another type of conventional multilayer electronic component 4.

FIG. 14 shows another multilayer electronic component 42a which is covered with a case 41a. Referring to FIG. 14, elements corresponding to those shown in FIG. 13 are denoted by similar reference numerals, to omit redundant description.

Referring to FIG. 14, a laminate 43 which is provided in the multilayer electronic component 42a is formed not only with steps 44 but with additional steps 48. On the other hand, the case 41a is provided with steps 49 which are engaged with the steps 48. The steps 49 of the case 41a are engaged with the steps 48 of the laminate 43 so that the case 41a is even more strongly mounted on the laminate 43. Even if force is applied to the upper surface of the case 41a to downwardly press the same, in particular, the case 41a is not disengaged from the external electrodes 45. Such force of downwardly pressing the case 41a is often applied from a vacuum suction chuck (not shown) which sucks the multilayer electronic component 42a toward the upper surface of the case 41 for holding the same. The steps 48 can be formed on the laminate 43 by a method similar to that for the steps 44. Namely, grooves similar to the grooves 20 may be formed from below in positions corresponding to the grooves 20 in the stage of the mother laminate 14 shown in FIG. 3.

FIGS. 17 to 38 show a part of respective ones of mother insulating sheets 51 to 72 included in the mother laminate prepared for obtaining a multilayer electronic component in accordance with a still further embodiment of the present invention. In these figures, cutting lines 73 which correspond to the cutting lines 15 shown in FIG. 2 are shown as one dot chain lines. A plurality of regions sectioned by these cutting lines 73 each provide an individual multilayer electronic component. FIGS. 17 to 38 each show completely only one region sectioned by the cutting lines, that is, the region for providing one multilayer electronic component. Substantially similar elements are not shown in the regions partially illustrated around the completely shown region.

Figure 17:
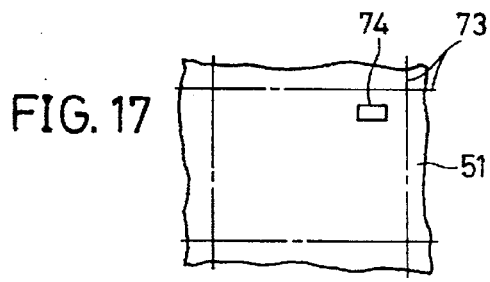
FIGS. 17–38 show sequentially insulating sheets 51 to 72 that are stacked to obtain multilayer electronic components according to yet another embodiment of the present invention.

In the mother laminate, mother insulating sheet 51 shown in FIG. 17 is positioned at the top, and mother insulating sheets 52, . . . , 72 are stacked therebelow in this order. As to the relation with respect to the multilayer electronic component shown in FIG. 1, the upper surface of mother insulating sheet 51 shown in FIG. 17 corresponds to the lower surface of multilayer electronic component 10 shown in FIG. 1, and the lower surface of mother insulating sheet 72 shown in FIG. 38 corresponds to the upper surface of multilayer electronic component 10. Each multilayer electronic component obtained by stacking mother insulating sheets 51 to 72 implements an equivalent circuit shown in FIG. 39. FIG. 39 shows a bandpass filter circuit.

Referring to FIG. 17, a mark 74 is applied on sheet 51. Mark 74 is used for determining direction when the multilayer electronic component is to be mounted.

Figure 18:
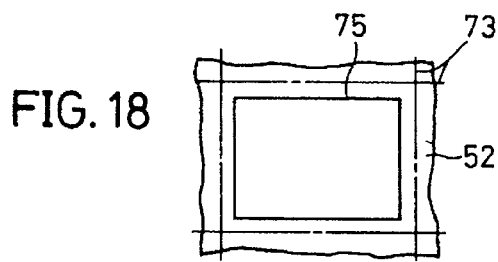

Referring to FIG. 18, a shield electrode 75 is formed on sheet 52.

Figure 19:
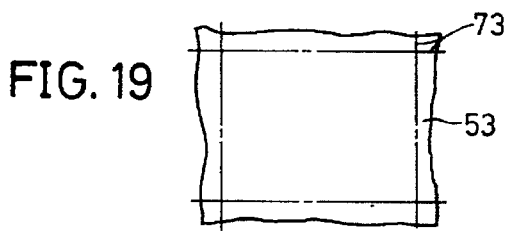

Referring to FIG. 19, no element is applied on sheet 53.

Figure 20:
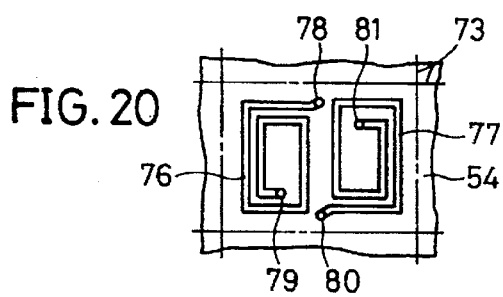

Referring to FIG. 20, two coil-shaped conductive films 76 and 77 are formed juxtaposed on sheet 54. At respective ends of coil-shaped conductive film 76, via holes 78 and 79 are formed, and at respective ends of coil-shaped conductive film 77, via holes 80 and 81 are formed. Conductive material is filled in via holes 78 to 81.

Figure 21:
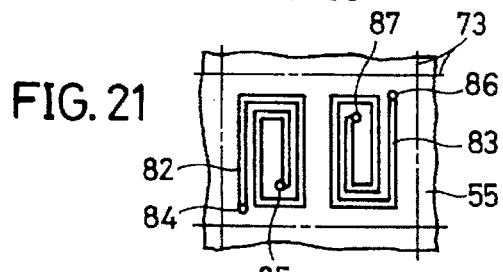

Referring to FIG. 21, two coil-shaped conductive films 82 and 83 are formed juxtaposed on sheet 55. At respective ends of coil-shaped conductive film 82, via holes 84 and 85 are formed, and at respective ends of coil-shaped conductive film 83, via holes 86 and 87 are formed. A conductive material is filled in via holes 84 to 87. Via hole 85 has its position corresponding to the position of via hole 79 provided in sheet 54, and it is electrically connected to via hole 79. Via hole 87 has its position corresponding to via hole 81 and is electrically connected to the via hole 81.

Figure 22:
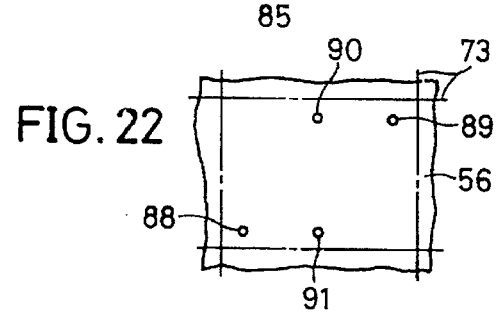

Referring to FIG. 22, four via holes 88 to 91, which are filled with a conductive material, are provided in sheet 56. Via hole 88 has its position corresponding to the via hole 84 provided in sheet 55, and it is electrically connected to via hole 84. Via hole 89 has its position corresponding to via hole 86, and it is electrically connected to via hole 86.

Figure 23:
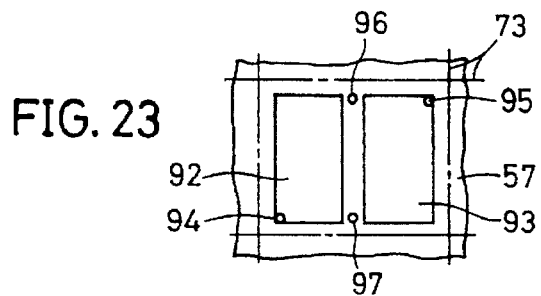

Referring to FIG. 23, two capacitor electrodes 92 and 93 are formed juxtaposed on sheet 57. A via hole 94 is formed to be electrically connected to capacitor electrode 92, and a via hole 95 is formed to be electrically connected to capacitor electrode 93. Between capacitor electrodes 92 and 93, via holes 96 and 97 are formed. A conductive material is filled in via holes 94 to 97. Via holes 94, 95, 96 and 97 are electrically connected to via holes 88, 89, 90 and 91, respectively.

Figure 24:
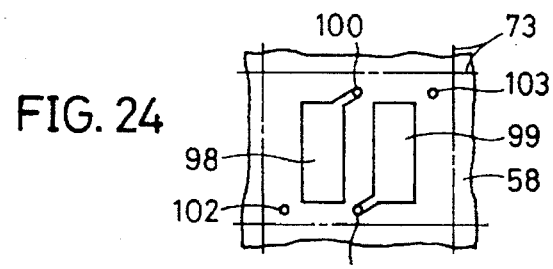

Referring to FIG. 24, two capacitor electrodes 98 and 99 are formed juxtaposed on sheet 58. A via hole 100 is provided to be electrically connected to capacitor electrode 98, and a via hole 101 is provided to be electrically connected to capacitor electrode 99. Via holes 102 and 103 are provided in sheet 58. A conductive material is filled in these via holes 100 to 103. Via holes 100, 101, 102 and 103 are electrically connected to via holes 96, 97, 94 and 95, respectively.

Figure 25:
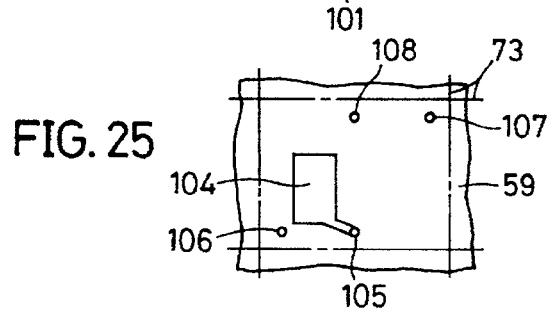

Referring to FIG. 25, a capacitor electrode 104 is formed on sheet 59 to be opposed to capacitor electrode 98. A via hole 105 is provided to be electrically connected to capacitor electrode 104. Via holes 106, 107 and 108 are provided in sheet 59. A conductive material is filled in via holes 105 to 108. Via holes 105, 106, 107 and 108 are electrically connected to via holes 101, 102, 103 and 100, respectively.

Figure 26:
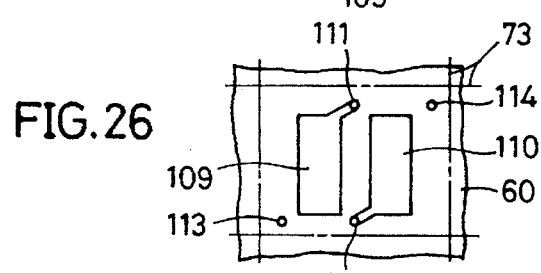

Referring to FIG. 26, two capacitor electrodes 109 and 110 are formed juxtaposed on sheet 60. A via hole 111 is provided to be electrically connected to capacitor electrode 109, and a via hole 112 is provided to be electrically connected to capacitor electrode 110. Via holes 113 and 114 are provided in sheet 60. A conductive material is filled in via holes 111 to 114. Via holes 111, 112, 113 and 114 are electrically connected to via holes 108, 105, 106 and 107, respectively.

Figure 27:
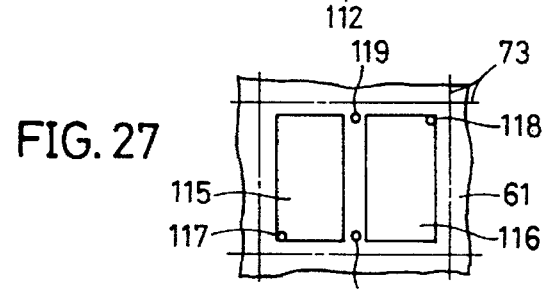

Referring to FIG. 27, two capacitor electrodes 115 and 116 are formed juxtaposed on sheet 61. A via hole 117 is provided to be electrically connected to capacitor electrode 115, and a via hole 118 is provided to be electrically connected to capacitor electrode 116. Further, via holes 119 and 120 are provided in sheet 61. A conductive material is filled in these via holes 117 to 120. Via holes 117, 118, 119 and 120 are electrically connected to via holes 113, 114, 111 and 112, respectively.

Figure 28:
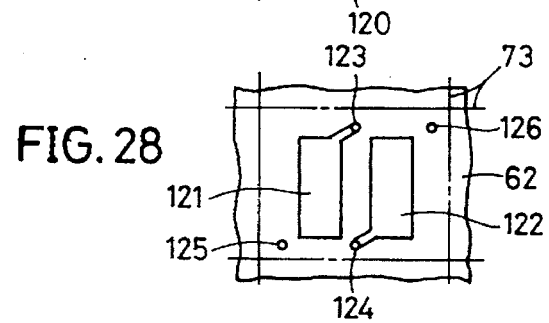

Referring to FIG. 28, two capacitor electrodes 121 and 122 are formed juxtaposed on sheet 62. A via hole 123 is provided to be electrically connected to capacitor electrode 121, and a via hole 124 is provided to be electrically connected to capacitor electrode 122. Via holes 125 and 126 are formed in sheet 62. A conductive material is filled in via holes 123 to 126. Via holes 123, 124, 125 and 126 are electrically connected to via holes 119, 120, 117 and 118, respectively.

Figure 29:
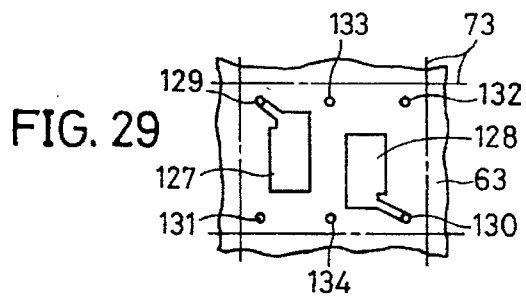

Referring to FIG. 29, two capacitor electrodes 127 and 128 are formed juxtaposed on sheet 63. A via hole 129 is provided to be electrically connected to capacitor electrode 127, and a via hole 130 is provided to be electrically connected to capacitor electrode 128. Via holes 131 to 134 are provided in sheet 63. A conductive material is filled in via holes 129 to 134. Via holes 131, 132, 133 and 134 are electrically connected to via holes 125, 126, 123 and 124, respectively.

Figure 30:
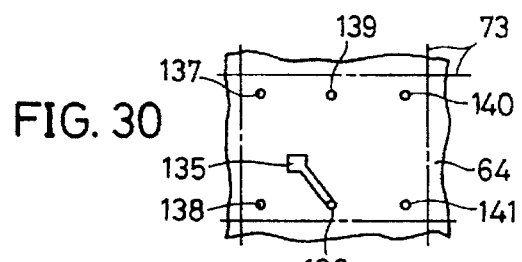

Referring to FIG. 30, a capacitor electrode 135 is formed on sheet 64 to be opposed to capacitor electrode 127 on sheet 63. A via hole 136 is provided to be electrically connected to capacitor electrode 135. Via holes 137 to 141 are provided in sheet 64. A conductive material is filled in via holes 136 to 141. Via holes 136, 137, 138, 139, 140 and 141 are electrically connected to via holes 134, 129, 131, 133, 132 and 130, respectively.

Figure 31:
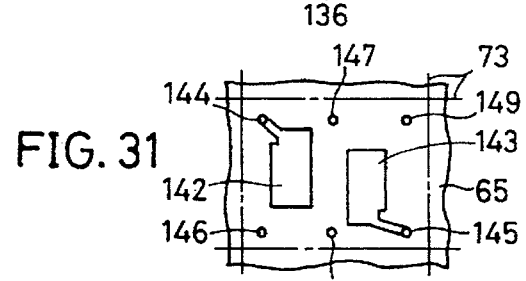

Referring to FIG. 31, two capacitor electrodes 142 and 143 are formed juxtaposed on sheet 65. A via hole 144 is provided to be electrically connected to capacitor electrode 142, and a via hole 145 is provided to be electrically connected to capacitor electrode 143. Via holes 146 to 149 are provided in sheet 65. A conductive material is filled in via holes 144 to 149. Via holes 144, 145, 146, 147, 148 and 149 are electrically connected to via holes 137, 141, 138, 139, 136 and 140, respectively.

Figure 32:
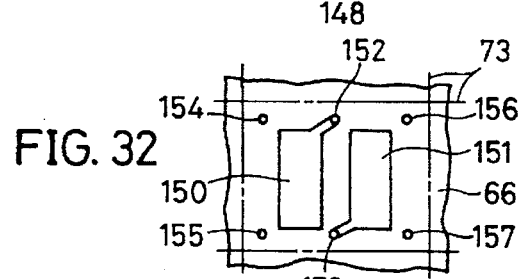

Referring to FIG. 32, two capacitor electrodes 150 and 151 are formed juxtaposed on sheet 66. A via hole 152 is provided to be electrically connected to capacitor electrode 150, and a via hole 153 is provided to be electrically connected to capacitor electrode 151. Via holes 154 to 157 are formed in sheet 66. A conductive material is filled in via holes 152 to 157. Via holes 152, 153, 154, 155, 156 and 157 are electrically connected to via holes 147, 148, 144, 146, 149 and 145, respectively.

Figure 33:
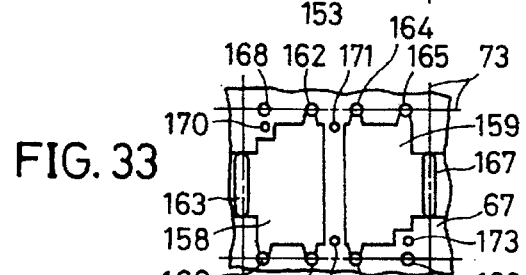

Referring to FIG. 33, two capacitor electrodes 158 and 159 are formed juxtaposed on sheet 67. Via holes 160 to 163 are provided to be electrically connected to capacitor electrode 158, and via holes 164 to 167 are provided to be electrically connected to capacitor electrode 159. Via holes 168 to 173 are provided in sheet 67. A conductive material is filled in these via holes 160 to 173. Via holes 160 to 169 are positioned on cutting lines 73. Via holes 163 and 167 have elongate shape. Via holes 170, 171, 172 and 173 are electrically connected to via holes 154, 152, 153 and 157, respectively. Capacitor electrode 158 is electrically connected to via hole 155, and capacitor electrode 159 is electrically connected to via hole 156.

Figure 34:
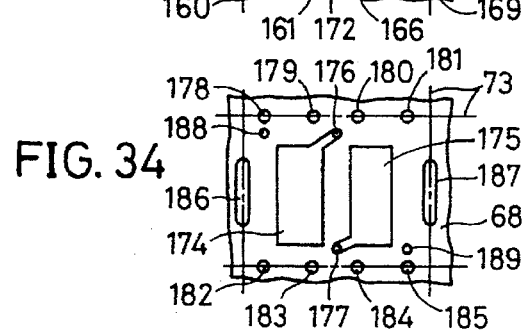

Referring to FIG. 34, two capacitor electrodes 174 and 175 are formed juxtaposed on sheet 68. A via hole 176 is provided to be electrically connected to capacitor electrode 174, and a via hole 177 is provided to be electrically connected to capacitor electrode 175. Via holes 178 to 189 are provided in sheet 68. A conductive material is filled in these via holes 176 to 189. Via holes 176, 177, 178, 179, 180, 181, 182, 183, 184, 185, 186, 187, 188 and 189 are electrically connected to via holes 171, 172, 168, 162, 164, 165, 160, 161, 166, 169, 163, 167, 170 and 173, respectively.

Figure 35:
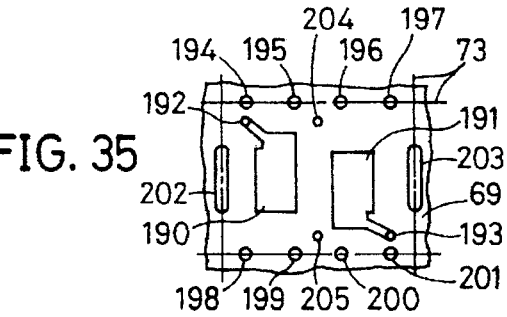

Referring to FIG. 35, two capacitor electrodes 190 and 191 are formed juxtaposed on sheet 69. A via hole 192 is provided to be electrically connected to capacitor electrode 190, and a via hole 193 is provided to be electrically connected to capacitor electrode 191. Via holes 194 to 205 are provided in sheet 69. A conductive material is filled in via holes 192 to 205. Via holes 192, 193, 194, 195, 196, 197, 198, 199, 200, 201, 202, 203, 204 and 205 are electrically connected to via holes 188, 189, 178, 179, 180, 181, 182, 183, 184, 185, 186, 187, 176 and 177, respectively.

Figure 36:
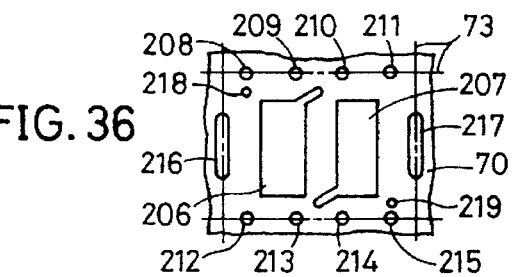

Referring to FIG. 36, two capacitor electrodes 206 and 207 are formed juxtaposed on sheet 70. Via holes 208 to 219 are formed in sheet 70. A conductive material is filled in these via holes 208 and 219. Via holes, 208, 209, 210, 211, 212, 213, 214, 215, 216, 217, 218 and 219 are electrically connected to via holes 194, 195, 196, 197, 198, 199, 200, 201, 202, 203, 192 and 193, respectively. Capacitor electrodes 206 and 207 are electrically connected to via holes 204 and 205, respectively.

Figure 37:
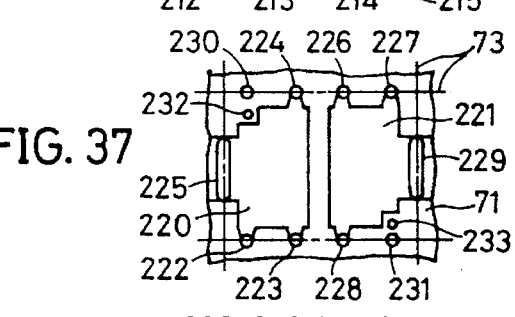

Referring to FIG. 37, two capacitor electrodes 220 and 221 are formed juxtaposed on sheet 71. Via holes 222 to 225 are formed to be electrically connected to capacitor electrode 220, and via holes 226 to 229 are formed to be electrically connected to capacitor electrode 221. Via holes 230 to 233 are formed in sheet 71. A conductive material is filled in these via holes 222 to 233. Via holes 222, 223, 224, 225, 226, 227, 228, 229, 230, 231, 232 and 233 are electrically connected to via holes 212, 213, 209, 216, 210, 211, 214, 217, 208, 215, 218 and 219, respectively.

Figure 38:
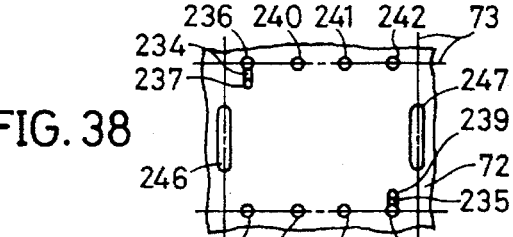
Figure 39:
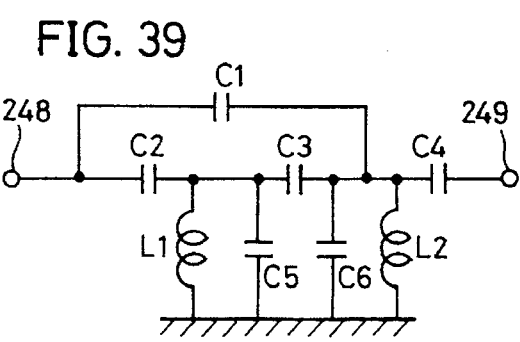
FIG. 39 shows a band pass filter circuit.

Referring to FIG. 38, connecting conductive films 234 and 235 are formed on sheet 72. Via holes 236 and 237 are formed at respective ends of connecting conductive film 234, and at respective ends of connecting conductive film 235, via holes 238 and 239 are formed. Via holes 240 to 247 are formed in sheet 72. A conductive material is filled in these via holes 236 to 247. Via holes 236, 237, 238, 239, 240, 241, 242, 243, 244, 245, 246 and 247 are electrically connected to via holes 230, 232, 231, 233, 224, 226, 227, 222, 223, 228, 225 and 229, respectively.

By dividing the mother laminate obtained by stacking such mother insulating sheets 51 to 72 along the cutting lines 73, a plurality of desired multilayer electronic components can be obtained.

Ten external electrodes are formed on the obtained multilayer electronic component. The first external electrode is provided by the conductive material in via holes 168, 178, 194, 208, 230 and 236. The second external electrode is provided by the conductive material in via holes 162, 179, 195, 209, 224 and 240. The third external electrode is provided by the conductive material in via holes 164, 180, 196, 210, 226 and 241. The fourth external electrode is provided by the conductive material in via holes 165, 181, 197, 211, 227 and 242. The fifth external electrode is provided by the conductive material in via holes 160, 182, 198, 212, 222 and 243. The sixth external electrode is provided by the conductive material in via holes 161, 183, 199, 213, 223 and 244. The seventh external electrode is provided by the conductive material in via holes 166, 184, 200, 214, 228 and 245. The eighth external electrode is provided by the conductive material in via holes 169, 185, 201, 215, 231 and 238. The ninth external electrode is provided by the conductive material in via holes 163, 186, 202, 216, 225 and 246. The tenth external electrode is provided by the conductive material in via holes 167, 187, 203, 217, 229 and 247.

Of the first to tenth external electrodes mentioned above, the first and the eighth external electrodes function as input/output terminals 248 and 249 shown in FIG. 39. The second to seventh, ninth and tenth external electrodes function as ground terminals.

On two opposite side surfaces of such a chip-shaped multilayer electronic component, the first and the eighth external electrodes serving as the input/output terminals 248 and 249 are formed. The ninth and tenth external electrodes have relatively wider area as compared with the other external electrodes.

In the above described multilayer electronic component, some of the external electrodes are connected not only to a specific internal circuit element but also function to electrically connect a plurality of internal circuit elements to each other. For example, the second, fifth, sixth and ninth external electrodes electrically connect capacitor electrodes 158 and 220 to each other. The third, fourth, seventh and tenth external electrodes electrically connect capacitor electrodes 159 and 221 to each other.

The multilayer electronic component described above includes capacitors C1 to C6 and inductors L1 and L2 as internal circuit elements, as shown in FIG. 39. However, such internal circuit elements may include resistance, distributed strip line, microstrip line and so on. An appropriate electronic component may be mounted on the top surface of the multilayer electronic component, that is, the top surface of sheet 51 shown in FIG. 17.

Although the present invention has been described and illustrated in detail, it is clearly understood that the same is by way of illustration and example only and is not to be taken by way of limitation, the scope of the present invention being limited only by the terms of the appended claims.

What is claimed is:

1. A multilayer electronic component for mounting on a surface of a substrate with external electrodes of said multilayer electronic component being soldered to the substrate, the multilayer electronic component comprising:

a laminated ceramic sintered body having a plurality of stacked insulating sheets with internal circuit elements interposed therebetween, said ceramic sintered body having first and second opposite major surfaces and side surfaces connecting said major surfaces with each other;

said side surfaces having a boundary surface that extends parallel to said major surfaces so as to define a first portion of said ceramic sintered body that includes said first major surface, and a second portion of said ceramic sintered body that includes said second major surface;

a plurality of external electrodes provided on outer surfaces of said ceramic sintered body, at least one of said external electrodes comprising an exposed conductor located in a recess, said recess being a portion of a via hole formed in said ceramic sintered body, said exposed conductor being electrically connected with said internal circuit elements, said external electrodes being exposed only on said first portion of said ceramic sintered body.

2. A multilayer electronic component in accordance with claim 1, wherein said insulating sheets include via holes, conductive materials being filled in said via holes and said external electrodes being exposed side portions of said conductive materials in said via holes.

3. A multilayer electronic component in accordance with claim 1, wherein said insulating sheets include via holes, conductive materials being layered on inner peripheral surfaces of said via holes and said external electrodes being exposed side portions of said conductive materials in said via holes.

4. A multilayer electronic component in accordance with claim 1, further comprising a second electronic component on said second major surface of said ceramic sintered body.

5. A multilayer electronic component in accordance with claim 4, further comprising a case structured and arranged on said ceramic sintered body so as to cover said second electronic component.

6. A multilayer electronic component in accordance with claim 1, wherein steps are formed on said side surfaces of said ceramic sintered body to correspond to the position of said boundary surface defining said first and second portions.

7. A multilayer electronic component in accordance with claim 1, wherein said external electrodes are exposed on side surfaces and said first major surface of said first portion of said ceramic sintered body.

8. A multilayer electronic component in accordance with claim 1, wherein said external electrodes are exposed only on side surfaces of said first portion of said ceramic sintered body.

9. A multilayer electronic component in accordance with claim 1, wherein said external electrodes include input/output terminals that are located on two opposite side surfaces of the ceramic sintered body.

10. A multilayer electronic component in accordance with claim 1, wherein said external electrodes include an external electrode that serves as a ground terminal.

11. A multilayer electronic component for mounting on a surface of a substrate with external electrodes of said multilayer electronic component being soldered to the substrate, the multilayer electronic component comprising:

a laminated ceramic sintered body having a plurality of stacked insulating sheets with internal circuit elements interposed therebetween, said ceramic sintered body having first and second opposite major surfaces and side surfaces connecting said major surfaces with each other;

steps disposed on said side surfaces extending parallel to said major surfaces so as to define a first portion of said ceramic sintered body that includes said first major surface, and a second portion of said ceramic sintered body that includes said second major surface, side surfaces of said first portion being recessed relative to side surfaces of said second portion;

a plurality of external electrodes provided on outer surfaces of said ceramic sintered body, at least one of said external electrodes comprising an exposed conductor located in a recess, said recess being a portion of a via hole formed in said ceramic sintered body, said exposed conductor being electrically connected with said internal circuit elements, said external electrodes being exposed only on said first portion of said ceramic sintered body.

12. A multilayer electronic component in accordance with claim 11, wherein said multilayer electronic component is a composite component including a winding pattern and at least one electronic chip component located on a surface of said multilayer electronic component, said wiring pattern being electrically connected to said at least one electronic chip component and said internal circuit elements for electrically connecting said at least one electronic chip component to said internal circuit elements.

13. A multilayer electronic component in accordance with claim 12, wherein said external electrodes do not contact said steps.

* * * * *